United States Patent
Watakabe et al.

(10) Patent No.: US 6,203,912 B1
(45) Date of Patent: Mar. 20, 2001

(54) ELECTRONIC ARTICLE HAVING FLUOROPOLYMER THIN FILM

(75) Inventors: Atsushi Watakabe; Jun-ichi Tayanagi; Masayuki Tamura; Haruhisa Miyake, all of Yokohama (JP)

(73) Assignee: Asahi Glass Company. Ltd., Tokyo (JP)

( * ) Notice: Subject to any disclaimer, the term of this patent is extended or adjusted under 35 U.S.C. 154(b) by 0 days.

(21) Appl. No.: 09/015,222

(22) Filed: Jan. 29, 1998

(30) Foreign Application Priority Data

Jan. 31, 1997 (JP) .................................................. 9-019165
Jul. 28, 1997 (JP) .................................................. 9-201852

(51) Int. Cl.$^7$ .................................................. B32B 27/00
(52) U.S. Cl. .................. 428/421; 428/422; 524/265; 524/462; 524/463; 525/326.2; 525/326.3; 526/246; 526/247; 526/248; 526/255
(58) Field of Search ............................. 525/326.3, 326.2; 526/248, 247, 246, 255; 428/421, 422; 524/463, 265, 462

(56) References Cited

U.S. PATENT DOCUMENTS 5,498,657 * 3/1996 Sugiyama et al. .................. 526/247
5,700,879 * 12/1997 Yamamoto ........................ 525/326.3

FOREIGN PATENT DOCUMENTS 0 178 935    4/1986    (EP) .
0 507 468   10/1992    (EP) .
2 087 874    6/1982    (GB) .
WO 95/28442 10/1995    (WO) .

OTHER PUBLICATIONS

Patent Abstracts of Japan, vol. 013, No. 367 (C–626), Aug. 15, 1989, JP 01 123849, May 16, 1989.
Patent Abstracts of Japan, vol. 017, No. 030 (C1018), Jan. 20, 1993, JP 04 252506, Sep. 8, 1992.

* cited by examiner

*Primary Examiner*—Cathy Lam
(74) *Attorney, Agent, or Firm*—Oblon, Spivak, McClelland, Maier & Neustadt, P.C.

(57) ABSTRACT

An electronic article having a thin film of a triazine ring-containing fluoropolymer obtained by trimerization of a cyano group of a cyano group-containing fluoropolymer having a polymerization unit of the formula (1):

$$-[CF_2-CF(A^1)]- \quad (1)$$

wherein $A^1$ is $-OR^1CN$, $-CN$ or $-R^1CN$, and $R^1$ is a $C_1$–$C_{15}$ polyfluoroalkylene group which may have an ether bond.

6 Claims, No Drawings

ELECTRONIC ARTICLE HAVING FLUOROPOLYMER THIN FILM

The present invention relates to an electronic article having a thin film of a triazine ring-containing fluoropolymer, a prepreg prepared by impregnating a reinforcing material with a cyano group-containing fluoropolymer, a method for preparing a cyano group-containing fluoropolymer and a paint composition for an electronic article which contains a cyano group-containing copolymer.

Recently, in proportion to developments of miniaturization, high integration-modification and high density-modification of a semiconductor element or a multi-layered circuit board, it is demanded to provide an insulating material having a low dielectric constant which enables to reduce a delay time of signal propagation. Examples of a material widely used at present as a buffer coating film of a semiconductor element, a passivation film of a semiconductor element, an insulating film between layers of a semiconductor element, an α ray-shielding film of a semiconductor element or an insulating film between layers of a multi-layered circuit board, includes a silicon oxide film, a silicon nitride film, a polyimide resin and the like, but they have a high relative dielectric constant respectively of 4–5, 7–9, 3.5–4 or the like, and it is demanded to provide a material having a low relative dielectric constant of at most 3.

A fluororesin has various desirable properties of not only a low dielectric constant but also a high heat resistance, a high chemical resistance and the like, and accordingly, its development is widely conducted.

However, a semiconductor element or a multi-layered circuit board is a composite of a circuit metal, other inorganic insulating films and the like, but since they are exposed to a high temperature of from 200 to 450° C., a fluororesin is hardly usable for this purpose because it has a low glass transition temperature and has an undesirable fluidity, a small elastic modulus and a high linear expansion coefficient in a higher temperature zone and therefore has a low reliability to be used for a semiconductor element or a circuit board.

JP-A-6-340710 discloses a triazine ring-containing fluoropolymer, but does not disclose an electronic article having a thin film of this polymer. Further, this reference does not disclose that a cyano group-containing fluoropolymer of averagely tetramer or higher provides a excellent mechanical property and pyrolysis resistance at a high temperature.

On the other hand, in a print circuit board, a delay time of signal propagation is proportional to a square root of a dielectric constant of an insulating substrate for circuit, so it is certainly demanded to provide a print circuit board using an insulating substrate having a low dielectric constant due to the requirement of a high-speed signal propagation. Examples of an insulating substrate used heretofor include a substrate obtained by impregnating a glass cloth or paper with an epoxy resin and curing the impregnated material, a substrate obtained by impregnating paper with a phenolic resin and curing the impregnated material, a substrate obtained by impregnating a glass fiber with a polyimide and curing the impregnated material, and the like, but since the resins thus used have a high dielectric constant, and a relative dielectric constant of the insulating substrates thus obtained is higher than 3.

A substrate composed of a glass cloth and polytetrafluoroethylene (PTFE) is known to have a low dielectric constant, but this substrate is required to be cured at a high temperature of at least 300° C. and has a problem in respect to an adhesive property to a metal foil and has a difficulty in processability. PTFE has a very high melting viscosity of from $10^{12}$ to $10^{13}$ poises, and is therefore poor in workability. JP-A-62-283694 and JP-A-8-157621 disclose an example of using a polytetrafluoroethylene porous material as a reinforcing material, but there is disclosed no example of using a combination of a fluororesin and a fluororesin porous material.

Accordingly, an object of the present invention is to provide an electronic article having a thin film of a triazine ring-containing fluoropolymer excellent in mechanical properties and pyrolysis resistance, while maintaining excellent properties of a low dielectric constant and a high chemical resistance of a fluororesin. Another object of the present invention is to provide an easily moldable prepreg obtained by impregnating a reinforcing material with a cyano group-containing fluoropolymer, a method for preparing a cyano group-containing fluoropolymer and a paint composition for an electronic article containing a cyano group-containing fluoropolymer.

Thus, the present invention provides an electronic article having a thin film of a triazine ring-containing fluoropolymer obtained by trimerization of a cyano group of a cyano group-containing fluoropolymer having a polymerization unit of the formula (1):

$$-[CF_2-CF(A^1)]- \quad (1)$$

wherein $A^1$ is $-OR^1CN$, $-CN$ or $-R^1CN$, and $R^1$ is a $C_1-C_{15}$ polyfluoroalkylene group which may have an ether bond.

Further, the present invention provides a prepreg obtained by impregnating a reinforcing material with a cyano group-containing fluoropolymer having a polymerization unit of the above formula (1).

Still further, the present invention provides a method for preparing a cyano group-containing fluoropolymer (iii) having a polymerization unit of the formula (1), which comprises reacting a fluoropolymer (i) having a polymerization unit of the formula (3) with ammonia to obtain a fluoropolymer (ii) having a polymerization unit of the formula (4) and subjecting the fluoropolymer (ii) to a nitrile-formation reaction to obtain a cyano group-containing fluoropolymer (iii) having a polymerization unit of the formula (1), characterized in that the nitrile-formation reaction is carried out in a solvent to dissolve the fluoropolymer (ii):

$$-[CF_2-CF(A^1)]- \quad (1)$$

$$-[CF_2-CF(A^2)]- \quad (3)$$

$$-[CF_2-CF(A^3)]- \quad (4)$$

wherein in the above formulas (1), (3) and (4), $A^1$ is $-OR^1CN$, $-CN$ or $-R^1CN$, $A^2$ is $-OR^1COOR^2$, $-COOR^2$ or $-R^1COOR^2$, $A^3$ is $-OR^1CONH_2$, $-CONH_2$ or $-R^1CONH_2$, $R^1$ is a $C_1-C_{15}$ polyfluoroalkylene group which may have an ether bond, and $R^2$ is a $C_1-C_{10}$ alkyl group which may have a fluorine atom or a chlorine atom.

Also, the present invention provides a paint composition for an electronic article, which contains a cyano group-containing fluoropolymer having a polymerization unit of the above formula (1).

In the polymerization unit of the above formula (1), $A^1$ is $-OR^1CN$, $-CN$ or $-R^1CN$, and $R^1$ is a $C_1-C_{15}$ polyfluoroalkylene group which may contain an ether bond. The proportion of the ether bond in the polyfluoroalkylene group is preferably one per 1–4 carbon atoms of the polyfluoroalkylene group. The wording "which may contain an ether bond" means that an ether bond composed of oxygen between carbon and carbon in $R^1$ may be contained.

The polyfluoroalkylene group means an alkylene group having at least 2 hydrogen atoms substituted with fluorine atoms, and includes a perfluoroalkylene group having all of hydrogen atoms of the alkylene group substituted with fluorine atoms and also includes an alkylene group having at least 2 hydrogen atoms substituted with fluorine atoms and having at least one hydrogen atom substituted with a halogen atom other than a fluorine atom. The halogen atom other than a fluorine atom is preferably a chlorine atom.

The polyfluoroalkylene group is preferably an alkylene group having at least 50%, more preferably at least 70% of the total hydrogen atoms substituted with fluorine atoms. Still further preferable polyfluoroalkylene group is a perfluoroalkylene group.

A cyano group-containing fluoropolymer having a polymerization unit of the formula (1) is obtained by polymerizing a vinyl compound of the following formula (2) in the presence of a radical-generating source or polymerizing a vinyl compound of the following formula (5) in the presence of a radical-generating source to obtain a fluoropolymer having a polymerization unit based on this vinyl compound and then converting a precursor substituent of a cyano group in the polymerization unit into a cyano group.

$$CF_2=CF(A^1) \quad (2)$$

$$CF_2=CF(B) \quad (5)$$

(In the above formula (2), $A^1$ is —$OR^1CN$, —CN or —$R^1CN$, and $R^1$ is a $C_1$–$C_{15}$ polyfluoroalkylene group which may contain an ether bond. In the above formula (5), B is a substituent of a precursor of a cyano group.)

The vinyl compound of the formula (2) may be used in combination of at least 2 compounds selected from vinyl compounds of the formula (2). The vinyl compound of the formula (5) may be used in combination of at least 2 compounds selected from vinyl compounds of the formula (5). Further, the vinyl compound may be used in combination of at least one compound selected from vinyl compounds of the formula (2) and at least one compound selected from vinyl compounds of the formula (5).

Preferable examples of the vinyl compound of the formula (2) include vinyl compounds as illustrated below.

$CF_2=CFO(CF_2)_pC\equiv N$
$CF_2=CF(OCF_2CF(CF_3))_qOCF_2CF(CF_3)C\equiv N$
$CF_2=CF(OCF_2CF(CF_3))_rO(CF_2)_sC\equiv N$
$CF_2=CF(OCF_2CF(CF_2Cl))_tOCF_2CF(CF_3)C\equiv N$
$CF_2=CF(OCF_2CF(CF_2Cl))_uO(CF_2)_vC\equiv N$
$CF_2=CFO(CF_2)_wOCF(CF_3)C\equiv N$
$CF_2=CF(C\equiv N)$
$CF_2=CF(CF_2)_pC\equiv N$
$CF_2=CF(CF_2CF(CF_3))_qOCF_2CF(CF_3)C\equiv N$
$CF_2=CF(CF_2CF(CF_3))_rO(CF_2)_sC\equiv N$
$CF_2=CF(CF_2CFCl)_tOCF_2CF(CF_3)C\equiv N$
$CF_2=CF(CF_2CFCl)_uO(CF_2)_vC\equiv N$
$CF_2=CF(CF2)_wOCF(CF_3)C\equiv N$ (wherein p is an integer of from 2 to 12, q is an integer of from 0 to 4, r is 1 or 2, s is an integer of from 1 to 4, t is an integer of from 0 to 4, u is 1 or 2, v is an integer of from 1 to 4, and w is an integer of from 2 to 5.)

The substituent which is a precursor of a cyano group in the vinyl compound of the formula (5), means a radical convertible into a cyano group by reaction with other compound. Concrete examples include $A^2$ and $A^3$ in the following formulas (3) and (4).

After polymerizing a vinyl compound of the formula (5), a —$COOR^2$ group, for example, is reacted with $NH_3$ to form a —$CONH_2$ group, and the —$CONH_2$ group thus formed is converted into a —$C\equiv N$ group by reaction with a dehydrating agent such as trifluoroacetic anhydride or phosphorus pentaoxide. In the nitrile-formation reaction employing a dehydrating agent which becomes an acid after the dehydration, it is preferable to use a basic compound to trap the acid by-produced, together with the dehydrating agent.

The basic compound is preferably a tertiary amine compound. Concrete examples of the basic compound include trialkylamines such as triethylamine or tributylamine, a substituted or unsubstituted pyridine, and the like.

While trifluoroacetic anhydride is used as the dehydrating agent, it is used in an amount of from 1 to 2.5 mols, preferably from 1.2 to 2.5 mols, more preferably from 1.2 to 2.0 mols, per mol of $A^3$ in the following formula (4) such as a —$CONH_2$ group.

Further, when a tertiary amine compound is used, together with trifluoroacetic anhydride, it is used in an amount of from 1 to 2.5 mols, preferably from 1.2 to 2.1 mols, per mol of trifluoroacetic anhydride.

A reaction temperature of the nitrile-formation reaction is generally from –20° C. to 60° C., preferably from –20° C. to 35° C., more preferably from –15° C. to 20° C. In order to control the reaction temperature, it is preferable to add a dehydrating agent gradually.

When polymerizing a vinyl compound of the formula (5) in the presence of a radical-generating source to obtain a fluoropolymer having a polymerization unit based on the vinyl compound and then converting a substituent (i.e. a precursor of a cyano group) in this polymerization unit into a cyano group, it is preferable to react a fluoropolymer (i) having a polymerization unit of the formula (3) with ammonia to obtain a fluoropolymer (ii) having a polymerization unit of formula (4) and then to carry out a nitrile-formation reaction of the fluoropolymer (ii) in a solvent for dissolving the fluoropolymer (ii) to obtain a cyano group-containing fluoropolymer (iii) of formula (1).

$$-[CF_2-CF(A^1)]- \quad (1)$$

$$-[CF_2-CF(A^2)]- \quad (3)$$

$$-[CF_2-CF(A^3)]- \quad (4)$$

(In the above formulas (1), (3) and (4), $A^1$ is —$OR^1CN$, —CN or —$R^1CN$, $A^2$ is —$OR^1COOR^2$, —$COOR^2$ or —$R^1COOR^2$, $A^3$ is —$OR^1CONH_2$, —$CONH_2$ or —$R^1CONH_2$, $R^1$ is a $C_1$–$C_{15}$ polyfluoroalkylene group which may contain an ether bond, and $R^2$ is a $C_1$–$C_{10}$ alkyl group which may have a fluorine atom or a chlorine atom.)

Examples of the solvent for dissolving a fluoropolymer (ii) include preferably ethers or a polar solvent. The solvent has a boiling point preferably of from 40 to 150° C. in view of safety, easiness of recovering a solvent, easiness of drying operation of a polymer and the like.

The ethers used are at least one member selected from the group of dialkylethers such as dipropylether, dibutylether, methyl-t-butylether or the like, cyclic ethers such as tetrahydrofuran, 1,4-dioxane or the like, and hydrofluoroethers illustrated below.

$n$-$C_3F_7OCH_3$, $n$-$C_3F_7OCH_2CF_3$, $n$-$C_3F_7OCH_2CH_3$, $n$-$C_4F_9OCH_3$, $i$-$C_4F_9OCH_3$, $n$-$C_4F_9OCH_2CH_3$, $i$-$C_4F_9OCH_2CH_3$, $n$-$C_4F_9OCH_2CF_3$, $n$-$C_5F_{11}OCH_3$, $n$-$C_5F_{11}OCH_2CH_3$, $CF_3OCF(CF_3)CF_2O$ $CH_3$, $CF_3OCHFCH_2OCH_3$, $CF_3OCHFCH_2OCH_2CH_3$

With a view to providing a good solubility, an asymmetric ether or a cyclic ether is preferred. Particularly preferred is methyl t-butyl ether.

The polar solvent used is at least one member selected from the group of compounds expressed by the formula $R^3$—CO—$NR^4R^5$ or $R^6R^7S$=O ($R^3$ is a hydrogen atom or a $C_1$–$C_6$ alkyl group, $R^4$ to $R^7$ are independently a $C_1$–$C_6$ alkyl group, and any of $R^3$ to $R^5$ may bond to form a cyclic structure), and alcohols. Preferable examples of the alcohols include $C_1$–$C_8$ aliphatic alcohols. A part or the whole part of hydrogen atoms of an alkyl group constituting the polar solvent may be substituted with fluorine atoms.

With a view to increasing the conversion in the dehydration reaction, preferable examples of the polar solvent include N,N-dimethylformamide, N,N-dimethylacetoamide, N-methylpyrrolidone, dimethylsulfoxide and the like, and more preferable examples of the polar solvent include N,N-dimethylformamide.

A method for reacting a fluorocopolymer (i) with ammonia preferably comprises dissolving a fluorocopolymer (i) in a solvent such as the above-mentioned ethers and then blowing an anhydrous ammonia gas thereinto or dropwise adding a cooled liquid ammonia thereto. This reaction is preferably carried out in an anhydrous system. The reaction temperature is not specially limited, but is preferably from −80° C. to 100° C., more preferably from −50° C. to 50° C., most preferably from −30° C. to 30° C.

In the present invention, a vinyl compound having a cyano group or its precursor (substituent) is polymerized preferably alone, but may be copolymerized with other fluorine-containing compounds, if necessary. A polymerization unit based on the other fluorine-containing compounds is at most 70 mol % or at most 50 mol %, preferably at most 30 mol %, to the total polymerization units.

Examples of the other fluorine-containing compounds to be copolymerized are not specially limited so long as they are copolymerizable with the vinyl compound having a cyano group or its precursor (substituent). Concrete examples of the other fluorine-containing compounds to be copolymerized, include tetrafluoroethylene, chlorotrifluoroethylene, trifluoroethylene, vinylidenefluoride, 1,1-dichloro-2,2-difluroethylene, fluoroethylene, hexafluoropropylene, perfluoro(3-butenylvinylether), perfluoro(allylvinylether), perfluoro(2, 2-dimethyl-1,3-dioxol), perfluoro(1,3-dioxol), perfluoro(2-methylene-4-methyl-1,3-dioxorane), perfluoro(3,5-dioxa-1, 6-heptadiene), vinylethers of the following chemical structures, and the like.

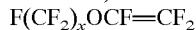
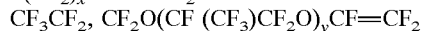

(wherein x is an integer of from 1 to 12, and y is an integer of from 1 to 50.)

Polymerization of a vinyl compound of the above formula (2) or (5) is carried out in the presence of a radical-generating source. While a polymer is required to have a thermal stability, the radical-generating source is preferably a fluoro type radical-generating source having such a fluoro group as to thermally stabilize a terminal of a cyano group-containing fluoropolymer, such as a polyfluoroalkyl group-containing compound which may have an ether bond, including such compounds as illustrated below.

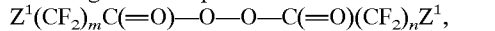
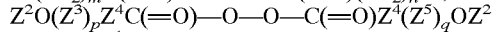

(wherein $Z^1$ is a fluorine atom, a chlorine atom or a hydrogen atom; m and n are independently an integer of from 1 to 12; $Z^2$ is —$(CF_2)_3F$ or —$CF(CF_3)_2$; $Z^3$ is —$CF(CF_3)CF_2O$—; $Z^4$ is —$CF(CF_3)$—; $Z^5$ is —$OCF_2CF(CF_3)$—; and p and q are independently an integer of from 0 to 5.)

The wording "which may have an ether bond" means that an ether bond composed of oxygen between carbon and carbon may be contained in a polyfluoroalkyl group.

Thus, this polyfluoroalkyl group such as $Z^1(CF_2)_m$— in the above formula is bonded to at least one terminal of both terminals of a cyano group-containing fluoropolymer, and it becomes thermally more stable.

The term "polyfluoroalkyl group" means an alkyl group having at least 2 hydrogen atoms substituted with fluorine atoms, and include a perfluoroalkyl group having all the hydrogen atoms of an alkyl group substituted with fluorine atoms and an alkyl group having at least 2 hydrogen atoms substituted with fluorine atoms and having at least one hydrogen atom substituted with a halogen atom other than a fluorine atom. The halogen atom other than a fluorine atom is preferably a chlorine atom.

The polyfluoroalkyl group is preferably an alkyl group having at least 50%, more preferably at least 70% of the total hydrogen atoms substituted with fluorine atoms. The polyfluoroalkyl group is more preferably a perfluoroalkyl group. A polyfluoroalkyl group has preferably from 1 to 15, more preferably from 2 to 7 carbon atoms.

When an ether bond is contained in a polyfluoroalkyl group, the proportion of the ether bond is preferably one per 1 to 4 carbon atoms of the polyfluoroalkyl group.

Other examples of the radical-generating source includes non-fluoro type radical-generating sources such as dialkylperoxydicarbonates, diacylperoxides, peroxyesters, dialkylperoxides, azobis compounds, persulfates and the like. Among them, dialkylperoxydicarbonates, diacylperoxides, peroxyesters, dialkylperoxides and persulfates are preferable since they do not cause problems of producing an initiator residue or denaturing and coloring a polymerization terminal. Further, when taking a decomposition temperature into consideration, dialkylperoxydicarbonates, diacylperoxyesters and persulfates are preferable. More preferable examples include dialkylperoxydicarbonates and diacylperoxides.

A polymerization reaction temperature of a vinyl compound of the formula (2) or (5) is selected preferably from the range of a 20° C. lower temperature than a temperature, at which a radical-generating source is decomposed and reduced to half for 10 hours, to 450° C. A more preferable temperature range is from a 10° C. lower temperature than a temperature, at which a radical-generating source is decomposed and reduced to half for 10 hours, to 400° C.

In order to accurately control the polymerization reaction to obtain a product having stable physical properties, the polymerization reaction may be carried out at a lower temperature within the above-mentioned temperature range and then may be carried out at a higher temperature. Also, photopolymerization can be carried out by irradiating with a visible light or ultraviolet ray in the presence of a photopolymerization initiator.

A fluoro type radical-generating source is used in an amount of preferably from 0.01 to 10 mols, more preferably from 0.05 to 5 mols, to 100 mols of a vinyl compound. If this amount is too small, a polymerization reaction does not satisfactorily proceed. On the other hand, if this amount is too large, heat resistance is lowered or an undesirable influence such as foaming is caused on a polymer.

An amount of a non-fluoro type radical-generating source is not specially limited, but is preferably from 0.01 to 50 mols, more preferably from 0.1 to 30 mols, to 100 mols of a vinyl compound.

A radical-generating source is consumed in proportion to the proceeding of polymerization reaction, but by continuously or batch-wise supplying a radical-generating source to maintain the above-mentioned amount in the polymerization system, a yield of a product can be raised by preventing a molecular weight from lowering.

A cyano group-containing fluoropolymer preferably has averagely at least 4 polymerization units of the formula (1) in one molecule, and by trimerizing a cyano group of this fluoropolymer, there is provided a triazine ring-containing fluoropolymer having a satisfactory mechanical property in a high temperature zone.

The upper limit of an average number of a polymerization unit of the formula (1) is not specially limited, but if the number of polymerization unit is too large, preparation of a fluoropolymer is not easy, and therefore the number of polymerization unit is suitably averagely at most 500. A preferable number of polymerization unit is averagely from 4 to 100, more preferably averagely from 5 to 50, and most preferably averagely from 7 to 30.

A curing reaction of a prepreg obtained by impregnating a reinforcing material with a cyano group-containing fluoropolymer having a polymerization unit of the formula (1) can be carried out only by heating, but in order to rapidly curing, a catalyst is usually incorporated into a prepreg. In place of incorporating a catalyst into a prepreg, a catalyst such as ammonia may be applied to a reinforcing material impregnated with a cyano group-containing fluoropolymer.

When a catalyst is used, the catalyst is at least one member selected from the group of amines, amidines, imidoylamidines, acids, tetraphenyl tin, transition metal salts of carboxylic acids and peroxides. Also, a catalyst used may be a blocked amine compound obtained by protecting a part or the whole part of active hydrogen of ammonia or an amine type compound with other functional groups.

A catalyst is used in an amount of preferably from 0.01 to 30 parts by weight, more preferably from 0.1 to 30 parts by weight, most preferably from 0.5 to 10 parts by weight to 100 parts by weight of a cyano group-containing fluoropolymer.

Amines used are at least one member selected from the group of aliphatic amines, aliphatic ring-containing amines, aromatic ring-containing amines and the like.

The amines used are at least one member selected from the group of primary amines, secondary amines and tertiary amines, and in view of a high catalytic activity, at least one member selected from primary amines and secondary amines is preferable, and primary amines are more preferable.

From a viewpoint of a high heat resistance of a cured product, aromatic ring-containing amines are preferable, and from a viewpoint of a high catalytic activity, aliphatic amines are preferable.

From a viewpoint of a high compatibility with a cyano group-containing fluoropolymer, it is preferable to use at least one member selected from fluoro type amines such as 2-fluoroalkylethylamine, 3-fluoroalkylpropylamine, 4-fluoroalkylaniline and 3-fluoroalkylaniline. It is preferable to use fluoro type amines having a fluoroalkyl group which scarcely influences directly on a nitrogen atom and which scarcely lowers a catalytic activity.

Examples of the primary amines include ethylamine, n-butylamine, sec-butylamine, tert-butylamine, 2-ethylhexylamine, stearylamine, cyclohexylamine, 4-methylcyclohexylamine, ethylenediamine, (2-perfluorobutyl)ethylamine, (3-perfluorobutyl) propylamine, 2-methoxyethylamine, 2-(2-methoxyethoxy) ethylamine, aniline, methylaniline, p-phenylenediamine, m-phenylenediamine, chloroaniline, trifluoromethylaniline, 3,6-hexafluorodimethylaniline, trifluoromethoxyaniline, (4-perfluorobutyl)aniline, allylamine, benzylamine and the like.

Examples of the secondary amines include piperidine, piperazine, diethylamine, di-n-butylamine, di-2-ethylhexylamine, N-methylaniline, diphenylamine, pyrrole, diallylamine, and the like.

Examples of the tertiary amines include triethylamine, triethylenediamine, N,N,N',N'-tetramethylethylenediamine, N,N-dimethylaniline, triallylamine, and the like.

Examples of the acids include protonic acids such as sulfuric acid, trifluoromethanesulfonic acid, chlorosulfuric acid or fluorosulfuric acid, Lewis acids such as halides of aluminum or titanium, alkoxides of aluminum or titanium, and the like. Examples of the carboxylic acids in transition metal salts of carboxylic acids include naphthenic acid, octenic acid, perfluorocarboxylic acid, and the like, and examples of the transition metals include Zn, Mn, Co, Cu, Sn and the like.

Preferable blocked amine compounds are compounds obtained by blocking ammonia, or some or all of active hydrogen atoms of the above amines, with silicon compounds such as hexamethyldisilazane and polysilazane.

Preferable examples of the blocked amine compounds include $C_2H_5(CH_3)C=NC_4H_9$, $(CH_3)_2C=NC_4H_9$, $C_6H_5N=C(CH_3)_2$, $CH_3-C_6H_4-N=C(CH_3)_2$, $(CH_3)_3SiNH_2$, $(CH_3)_3SiNHSi(CH_3)_3$, $n-C_4H_9NHSi(CH_3)_3$, $CH_3NHSi(CH_3)_3$, $CH_3N(Si(CH_3)_3)_2$, $C_2H_5NHSi(CH_3)_3$, $C_6H_5 NHSi(CH_3)_3$, and the like.

With the prepreg, there may be further blended other fluorocompounds substituted with one or two cyano groups, preferably perfluoroalkane or perfluoroether substituted with one or two cyano groups. The fluorocompound is used in an amount of from 1 to 100 parts by weight, preferably from 5 to 70 parts by weight, more preferably from 10 to 50 parts by weight, to 100 parts by weight of a cyano group-containing fluoropolymer.

Further, with the prepreg, there may be blended silicon compounds of the formula $R^8_e SiX_{4-e}$ (wherein $R^8$ is a $C_1$–$C_{30}$ organic group, X is a hydrolyzable group, and e is an integer of from 0 to 3) or polysilazanes having a basic repeating unit of the formula —(SiH$_2$NR)— (wherein R is a hydrogen atom or an alkyl group). The silicon compounds or the polysilazanes are used in an amount of from 0.01 to 50 parts by weight, preferably from 0.1 to 30 parts by weight, more preferably from 0.5 to 20 parts by weight, to 100 parts by weight of a cyano group-containing fluoropolymer.

Examples of the hydrolyzable group X include a hydrogen atom, a halogen atom, an alkoxy group, a hydroxyl group, an acyloxy group, a ketoxymate group, an amino group, an amide group, an aminoxy group, a mercapto group, an alkenyloxy group, and the like.

From the viewpoints of desirable reactivity and easy handling, preferable examples of X include a hydrogen atom, an alkoxy group, an aminoxy group, a ketoxymate group, and the like. Also, it is preferable that at least 2, more preferably at least 3 of these groups are bonded to one silicon atom. Also, preferable examples of $R^8$ include a methyl group, a phenyl group, a vinyl group, an amino group-containing alkyl group, a cyano group-containing alkyl group, a fluorine-containing alkyl group and the like.

Examples of the above silicon compounds include silane compounds such as methylsilicate, ethylsilicate, methyltrimethoxysilane, methyltriethoxysilane, phenyltrimethoxysilane, dimethyldimethoxysilane, dimethyldiethoxysilane, diphenyldimethoxysilane, trimethylethoxysilane, trimethoxysilane, dimethoxymethylsilane, diethoxysilane and triethoxysilane; vinylsilanes such as vinyltrimethoxysilane and vinylmethyldimethoxysilane; (meth)acryloxyalkylsilanes such as 3-acryloxypropyltrimethoxysilane, methacryloxypropyltrimethoxysilane and 3-methacryloxypropylmethyldimethoxysilane; amino group-containing silanes such as 3-aminopropyltrimethoxysilane, γ-aminopropylmethyldimethoxysilane, N-(2-aminoethyl)-3-aminopropyltrimethoxysilane, N-(2-aminoethyl)-3-aminopropylmethyldimethoxysilane, N-(2-aminoethyl)-3-aminopropyltriethoxysilane, 3-ureidepropyltriethoxysilane,

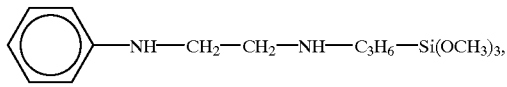

3-anilinopropyltrimethoxysilane, o-triethoxysilylaniline, m-trimethoxysilylaniline and p-trimethoxysilylaniline; cyano group-containing silanes such as trimethoxysilylbenzonitrile, trimethoxysilylperfluorobenzonitrile and 2-cyanoethyltrimethoxysilane; mercaptosilanes such as 3-mercaptopropyltrimethoxysilane, 3-mercaptopropylmethyldimethoxysilane and 3-mercaptopropylmethyldiethoxysilane; epoxysilanes such as 3-glycidoxypropyltrimethoxysilane and 3-glycidoxypropylmethyldimethoxysilane; isocyanatesilanes such as 3-isocyanatepropyltrimethoxysilane, 3-isocyanatepropyltriethoxysilane and 3-isocyantepropyldimethoxymethylsilane; fluorine-containing silanes such as 3,3,3-trifluoropropyltrimethoxysilane, 2-(perfluorooctyl)ethyltrimethoxysilane, 3-(perfluorooctyl)propyltrimethoxysilane, (perfluorophenyl)trimethoxysilane, 3,5-ditrifluoromethylphenyltrimethoxysilane and (perfluorooctyl)phenyltrimethoxysilane; and the like.

These silicon compounds may be used alone or in a combination of two or more. Further, silicon compounds obtained by previously reacting at least one of these silicon compounds may be used. Particularly, in view of curing reaction shrinkage, it is preferable to use silicon compounds obtained by previously condensing the above silicon compounds. Further, since a cyano group-containing fluoropolymer used in the present invention has a high fluorine content, it is preferable from the viewpoint of compatibility to use fluorine-containing silanes as silicon compounds. Still further, polysilazanes are preferably used since polysilazanes by-produce ammonia at the same time as condensation reaction, which has a function as a curing agent for a cyano group-containing fluoropolymer, and their shrinking rate is low.

Curing reaction by trimerization of a cyano group is conducted at a temperature in the range of from 25 to 450° C., preferably from 100 to 400° C., after impregnating a reinforcing material with a cyano group-containing fluoropolymer and drying.

A cyano group-containing fluoropolymer may be dissolved in a fluorine-containing organic solvent and impregnated into a reinforcing material to prepare a prepreg, or may be heated to lower a viscosity and bulkily impregnated into a reinforcing material to prepare a prepreg. The prepreg may be dried at such a low temperature as not to cause curing reaction, and may be cured at a higher temperature. When a drying temperature of prepreg is relatively high, drying and curing reaction may be conducted at the same time. The curing reaction may be carried out by step-wise or continuously raising a temperature.

Before impregnating a reinforcing material, a cyano group-containing fluoropolymer may be heated to raise a viscosity to such a degree as not to cause gelling. Uncured or semi-cured prepreg may be heat-pressed onto a metal foil to satisfactorily prepare a print circuit board.

A cyano group in the cyano group-containing fluoropolymer may be maintained as it is, but may be converted into an amidine group [—C(=NH)NH$_2$] by reacting with ammonia. Also, by reacting with other amidine compound [Rf$^1$—C(=NH)NH$_2$] (wherein Rf$^1$ is a polyfluoroalkyl group which may have an ether structure), it may be converted into an imidoylamidine structure [—C(=NH)—N=C(NH$_2$)—Rf$^1$ or —C(NH$_2$)=N—C(=NH)—Rf$^1$] (wherein Rf$^1$ is a polyfluoroalkyl group which may have an ether structure). These materials can also be cured under the above-mentioned curing conditions.

The reinforcing material used in the present invention may be materials generally used for laminate materials, and preferable examples include a fibrous substrate, a fluororesin porous material, and the like.

Examples of the fibrous substrate include various glass cloths or non-woven cloths of quartz glass, E glass or S glass containing SiO$_2$, Al$_2$O$_3$ and the like as the main components, D glass containing B$_2$O$_3$ as the main component, or the like, and various organic cloths or non-woven cloths of aromatic polyamide, PTFE or the like.

Preferable examples of a resin used for the fluororesin porous material include PTFE, and other tetrafluoroethylene/hexafluoropropylene copolymer, polyvinylidene fluoride, polyvinyl fluoride, and the like. The fluororesin porous material has a porosity of preferably from 5 to 95%, more preferably from 50 to 90%. The fluororesin porous material has a thickness of preferably from 1 to 500 μm, more preferably from 5 to 300 μm.

A paint composition for an electronic article containing a cyano group-containing fluoropolymer of the present invention is useful as a paint composition for forming a triazine ring-containing fluoropolymer thin film on an electronic article by trimerizing a cyano group of the cyano group-containing fluoropolymer. This paint composition is generally prepared by dissolving a cyano group-containing fluoropolymer in a solvent. The concentration of the cyano group-containing fluoropolymer in the solvent is preferably from 0.1 to 80 wt %, more preferably from 1 to 50 wt %.

This paint composition is coated on an electronic article, and forms a triazine ring-containing fluoropolymer thin film on the electronic article by drying the solvent. If the cyano group-containing fluoropolymer is liquid polymer, a triazine ring-containing fluoropolymer thin film can be formed without using a solvent.

The solvent for this paint composition may be a polymerization solvent used for polymerizing a vinyl compound of the formula (2) or (5).

The solvent is not specially limited so long as it dissolves a cyano group-containing fluoropolymer, but from the viewpoint of compatibility, it is preferable to use a fluorine-containing solvent containing at least one fluorine atoms. Also, from the viewpoints of easy handling and solvent removal after coating, the solvent has a boiling point of preferably from 20 to 350° C., more preferably from 40 to 300° C.

Examples of the solvent include polyfluoroaromatic compounds such as perfluorobenzene, pentafluorobenzene, trifluromethylbenzene, 1-chloro-4-trifluoromethylbenzene, 1,3-bis(trifluoromethyl)benzene, and 1,4-bis(trifluoromethyl)benzene; polyfluorotrialkylamine compounds such as perfluorotributylamine and perfluorotripropylamine; fluoroalkane compounds such as perfluorohexane, perfluorooctane, perfluorodecane, perfluorododecane, 2,7-bis(trifluoromethyl)octane, 2,5-bis (trifluoromethyl)hexane, 2H,3H-perfluoropentane, 1H-perfluorohexane, 1H-perfluorooctane, 1H-perfluorodecane, 1H,4H-perfluorobutane, 1H,1H,1H,2H,2H-perfluorohexane, 1H,1H,1H,2H,2H-perfluorooctane, 1H,1H,1H,2H,2H-perfluorodecane, 3H,4H-perfluoro-2-methylpentane, 2H,3H-perfluoro-2-methylpentane, 1,1-dichloro-2,2,3,3,3-pentafluoropropane, 1,3-dichloro-1,1,2,2,3-pentafluoropropane and 1,1-dichloro-1-fluoroethane; polyfluoroolefin compounds such as dimers of (perfluoro-n-octyl)ethylene, (perfluoro-n-hexyl)ethylene, (perfluoro-n-butyl)ethylene or hexafluropropene, and trimer of hexafluoropropene; polyfluorocycloalkane compounds such as perfluorodecaline, perfluorocyclohexane, perfluoro(1,3,5-trimethyl)cyclohexane and perfluoro(dimethylcyclobutane); perfluorocycloaliphatic ether compounds such as perfluoro (2-butyltetrahydrofuran); polyfluoroketones such as bis (heptafluoroisopropyl)ketone; fluorine-containing low molecular polyethers; fluorine-containing alcohols; and the like. They are used alone or in a mixture, but other compounds may also be widely used.

A paint composition usually contains a catalyst for trimerizing a cyano group to cure after coating. It is also possible to apply a catalyst such as ammonia after coating. Curing reaction can be carried out only by heating, but a catalyst is added to rapidly cure.

The kind and the amount of a catalyst used are selected by considering electronic uses, and a catalyst contain no metal is usually preferable. When a catalyst containing a metal atom is used, its amount used is as small as possible. A catalyst and its amount used may be the same as used for curing the above-mentioned prepreg.

The paint composition may further contain other fluoro compounds having one or two cyano groups, preferably perfluoroalkanes or perfluoroethers having one or two cyano groups. The amount of this fluoro compound contained may be the same as in the above-mentioned prepreg.

Curing reaction to trimerize a cyano group is carried out at a temperature in the range of from 25 to 450° C., preferably from 100 to 400° C., after coating a paint composition and drying at 25 to 400° C. After drying at a lower temperature as not to cause curing reaction, a paint composition may be cured at a higher temperature, but when a drying temperature is relatively high, drying and curing reaction may be conducted at the same time. A temperature may be step-wise or continuously raised.

A cyano group in a paint composition may be used as it is, but it may be converted into an amidine group (—C(=NH)NH$_2$) by reaction with ammonia. Also, a cyano group may be converted into an imidoylamidine structure (—C(=NH)—N=C(NH$_2$)—Rf or —C(NH$_2$)=N—C(=NH)—Rf, wherein Rf is a polyfluoroalkyl group which may have an ether structure) by reaction with another amidine compound (Rf—C(=NH)NH$_2$ wherein Rf is a polyfluoroalkyl group which may have an ether structure). These materials can be cured under the above-mentioned curing reaction conditions.

In order to improve heat resistance and hardness of the coating film thus formed, the paint composition may further contain silicon compounds of the formula $R^8_e SiX_{4-e}$ (wherein $R^8$ is a $C_1$–$C_{30}$ organic group, X is a hydrolyzable group, and e is an integer of from 0 to 3) or polysilazanes having a basic repeating unit of the formula —(SiH$_2$NR)— (wherein R is a hydrogen atom or an alkyl group), which are blended with the above-mentioned prepreg.

Also, in order to improve viscosity control or film formability, the paint composition may further contain a fluoropolymer other than a cyano group-containing fluoropolymer. From the viewpoints of solubility in the paint composition and pyrolysis resistance of a thin film, preferable examples of such a fluoropolymer include a non-crystalline perfluoropolymer, a fluorine-containing linear polymer having a melting point or a glass transition temperature lower than room temperature, and the like.

Concrete examples of the non-crystalline perfluoropolymer include poly(perfluoro(3-butenylvinylether)), poly(perfluoro(allylvinylether)), poly(perfluoro-2,2-dimethyl-1,3-dioxol), poly(perfluoro-1,3-dioxol), perfluoro-2,2-dimethyl-1,3-dioxol, a copolymer of tetrafluoroethylene with perfluoro-2,2-dimethyl-1,3-dioxol, poly(perfluoro-2-methylene-4-methyl-1,3-dioxorane), and the like.

Concrete examples of the fluorine-containing linear polymer include hexafluoropropyleneoxide homopolymer, a copolymer of tetrafluoroethylene with perfluoro (alkylvinylether) or perfluoropolyether such as poly (perfluorotrimethyleneglycol), for example, a copolymer of tetrafluoroethylene with perfluoro(methylvinylether), a copolymer of tetrafluoroethylene with perfluoro (propylvinylether), and the like.

The paint composition may be coated by various methods, examples of which include roll coater method, casting method, dipping method, spin coating method, die coating method, water casting method and the like, and any method can be used so long as a thin film can be formed from the paint composition. A thin film formation method of the present invention is appropriately selected by taking a shape of an electronic article applied or a required film thickness into consideration. The thin film has a film thickness selected from the range of preferably from 0.1 to 100 $\mu$m, more preferably from 0.1 to 50 $\mu$m, most preferably from 0.1 to 20 $\mu$m.

The thin film of the present invention can be used for a buffer coating film of a semiconductor element for an electronic article, a passivation film of a semiconductor element, an insulating film between layers of a semiconductor element, an a ray-shielding film of a semiconductor element or an insulating film between layers of a multi-layered circuit board. Examples of the multi-layered circuit board include a high density circuit board such as MCM (multi-tip module), and the like.

When the thin film of the present invention is used as an insulating film for an electronic circuit board, it can be used not only as an insulating material for a one-side board, a both-side board or a multi-layered board, but also as an insulating film for a build-up layer of a multi-layered circuit board (build-up board) having a single or plural insulating layer (build-up layer) formed on the surface of a base board of a one-side board, a both-side board or a multi-layered board.

The insulating film can be formed by coating a prepolymer or laminating a semi-cured film. Examples of the base board include various boards such as a resin board, a ceramic board, a metal board and the like.

Examples of the resin board include various combinations of a reinforcing material of glass cloth, glass non-woven cloth, aramid fiber or polytetrafluoroethylene porous material with epoxy resin, polyimide resin, bismaleimidetriazine resin, polyphenyleneoxide resin, polyphenyleneether resin, fluororesin or the like.

Examples of the ceramic board include a board of alumina, mullite, cordierite, steatite, forsterite, aluminium nitride, silicon carbide, beryllia, glass, single crystal alumina or the like.

Examples of the metal board include a board of aluminium, copper or the like. Further, a board of silicon or diamond can also be used.

The thin film of the present invention is sometimes required to be finely processed when it is used for a buffer coating film of a semiconductor element, a passivation film of a semiconductor element, an insulating film between layers of a semiconductor element, an α ray-shielding film of a semiconductor element or an insulating film between layers of a multi-layered circuit board.

In such a case, laser treatment, plasma treatment or the like can be applied. Examples of a light source for the laser treatment include ArF excimer laser, KrF excimer laser, carbonic acid gas laser and the like. Preferable examples of the plasma treatment include plasma dry etching method using a fluorinated hydrocarbon gas such as $CF_4$, $C_2F_6$ or the like.

Examples of the semiconductors in the present invention include individual semiconductors such as a diode, a transistor, a compound semiconductor, a thermistor, a varistor, a thyristor or the like, memory elements such as DRAM (Dynamic Random Access Memory), SRAM (Static Random Access Memory), EPROM (Erasable Programmable Read Only Memory), Mask ROM (Mask Read Only Memory), EEPROM (Electrical Erasable Programmable Read Only Memory), Flash Memory or the like, logic circuit elements such as a microprocessor, DSP, ASIC and the like, integrated circuit elements such as a compound semiconductor including MMIC (Monolithic Microwave Integrated Circuit), hybrid IC, a light emitting diode, a charge coupled element, and other photoelectric conversion elements.

By using the thin film of the present invention for a buffer coating film, a passivation film, an insulating film between layers or an α ray-shielding film of a semiconductor element, an element having excellent electric properties including a low dielectric constant and a high dielectric strength can be provided, and a delay time of signal propagation can be reduced, and a high reliability by excellent mechanical properties in a high temperature zone can be provided.

EXAMPLES

Now, the present invention will be described in further detail with reference to Examples, but it should be understood that the present invention is by no means restricted to such specific Examples.

The following abbreviations employed in the Examples have the following meanings.

PDMNN: Perfluoro(4,7-dioxa-5-methyl-8-nonenenitril) [$CF_2$=$CFOCF_2CF(CF_3)OCF_2CF_2CN$]

PBPO: Perfluoro(butanoylperoxide)

225 cb: 1,3-Dichloro-1,1,2,2,3-pentafluoropropane

PBTHF: Perfluoro(2-butyl-tetrahydrofuran)

DIPDC: Diisopropylperoxydicarbonate

MPOH: Methylperfluoro(5-oxa-6-heptenoate) [$CF_2$=$CFOCF_2CF_2CF_2COOCH_3$]

MTBE: t-Butylmethyl ether

DMF: N,N-dimethylformamide

PBVE: Perfluoro(butenylvinylether) [$CF_2$=$CFOCF_2CF_2CF$=$CF_2$]

DNPDC: Di-n-propylperoxydicarbonate

Example 1

7.8 g (20 mmol) of PDMNN was cooled with liquid nitrogen and was degassed, and 1.7 g (0.20 mmol as peroxide) of 5 wt % solution (solvent: 225 cb) of PBPO was added thereto under nitrogen atmosphere and was reacted for 2 hours.

The reaction solution was subjected to distillation under reduced pressure to remove a low boiling point component and was vacuum-dried to obtain 0.47 g of PDMNN homopolymer (8-mer).

According to $^{19}$F-NMR and IR measurement, most of terminal groups of the product were perfluoroalkyl groups based on a radical-generating source, and other chemical groups were not substantially present. The polymerization degree was calculated by determining the proportion of side chains and terminal groups according to $^{19}$F-NMR and increasing its value by twice since perfluoroalkyl groups based on the radical-generating source were present on both terminals.

Example 2

After 7.8 g (20 mmol) of PDMNN was cooled with liquid nitrogen and was degassed, 1.7 g (0.20 mmol as a radical-generating source) of 5 wt % solution (solvent: 225 cb) of PBPO was added thereto every one hour totally six times under nitrogen atmosphere and was reacted for six hours in total.

The reaction solution was subjected to distillation under reduced pressure to remove a low boiling point component and was vacuum-dried to obtain 2.4 g of PDMNN homopolymer (6-mer). 1 g of the polymer thus obtained was dissolved in 4 g of perfluorobutylamine, and 0.05 g of trifluoroacetoamidine was added thereto. The resultant mixture was fully stirred, and was filtrated by a polytetrafluoroethylene (PTFE) filter having a pore diameter of 0.5μ.

The solution thus filtrated was spin-coated on a silicon wafer, and was dried at 150° C. to form a thin film having a thickness of from 2 μm, and was heat-treated under nitrogen atmosphere at 300° C. for 1 hour. Infrared absorption spectrum of the thin film thus obtained exhibited a strong absorption of a triazine ring and did not exhibit an absorption of a cyano group.

Checker-like scratches were made on the thin film in accordance with JIS-K5400, and was heat-treated at 300° C. for 1 hour, but the checker-like shape did not change.

Example 3

The PDMNN homopolymer of Example 2 was dissolved in PBTHF, and ammonia gas was blown thereinto for 30 minutes to convert a cyano group to an amidine group. After distilling off the solvent, the polymer was vacuum-dried to obtain a fluorine-containing polymer.

The fluorine-containing polymer thus obtained was heat-cured at 300° C. for 2 hours, and according to thermogravimetric analysis, its pyrolysis-initiating temperature was 414° C. Also, a dry polymer was dissolved in 2-(perfluorohexyl)ethanol, and was spin-coated on a silicon wafer in the same manner as in Example 2, and was heated under nitrogen atmosphere at 300° C. for 1 hour. Checker-like scratches were made on the thin film in accordance with JIS-K5400, and the thin film thus treated was heat-treated at 300° C. for 1 hour, but there was no change in the checker-like shape.

Example 4

1.08 g of DIPDC was added to 9.76 g of PDMNN, and the mixture was polymerized at 40° C. for 63 hours. The reaction solution was subjected to distillation under reduced pressure to remove a low boiling point component, and was vacuum-dried to obtain 5.86 g of PDMNN homopolymer (11-mer).

The polymerization degree was calculated by measuring the proportion of terminal groups and monomer repeating units by using $^{19}$F-NMR and $^{1}$H-NMR in combination by using bis(trifluoromethyl)benzene as an internal standard.

Thereafter, the homopolymer thus obtained was dissolved in PBTHF in the same manner as in Example 3, and ammonia gas was blown thereinto for 30 minutes to convert to a cyano group to an amidine group. After removing the solvent by distillation, the reaction mixture was vacuum-dried to obtain a fluorine-containing polymer. The fluorine-containing polymer thus obtained was heat-cured at 300° C. for 2 hours, and according to thermogravimetric analysis, its pyrolysis-initiating temperature was 392° C.

Example 5

Into an autoclave having an internal volume of 100 cc, were added 61 g (0.2 mol) of MPOH and 17 g (0.02 mol as a radical-generating source) of 5 wt % solution (solvent: 225 cb) of PBPO, and the mixture was cooled with liquid nitrogen and was degassed, and was reacted at cyano group, in the same manner as in example 5, and after filtrating, a thin film having a thickness of about 2 μm was formed on a silicon wafer.

Infrared absorption spectrum of the thin film thus obtained exhibited a strong absorption of a triazine ring, but did not exhibit an absorption of a cyano group. The thin film thus obtained had an elastic modulus of less than $1 \times 10^9$ dyn/cm$^2$ at 300° C.

Example 8

306 g (1 mol) of MPOH was placed in a four-forked flask having an internal volume of 1000 cc, and was heated at 50° C. under nitrogen atmosphere. Thereafter, 85 g (0.01 mol as a radical-generating source) of 5 wt % solution (solvent: 225 cb) of PBPO was added thereto every 2 hours 3 times in all, and was reacted for 8 hours.

The reaction solution was subjected to distillation under reduced pressure to remove a low boiling point component, and was vacuum-dried to obtain 75 g of MPOH homopolymer (7-mer).

Thereafter, a —COOCH$_3$ group of the polymer was converted into an amide group by reaction with ammonia, and the converted amide group was further converted into a cyano group by using trifluoroacetic anhydride/pyridine. PBTHF was added to the fluorine-containing polymer thus obtained to prepare a 40 wt % solution, and Zn(C$_7$F$_{15}$COO)$_2$ was added in an mount of 1 etching, and the thin film was heat-treated at 300° C. for 1 hour again, but there was no change in the pore shape.

The thin film had an elastic modulus of $2 \times 10^9$ dyn/cm$^2$ at 300° C.

Example 6 (Comparative Example)

A perfluorobutylamine solution (concentration 9%) of PBVE homopolymer (intrinsic viscosity (η): 0.24 dL/g, measured at 30° C. by using PBTHF solution) was spin-coated on a silicon wafer, and was subjected to the same tests as above. In the heat-treatment test of checker-like scratches, fusing was caused between the checker-like scratches. Also, pores having a pore diameter of 2 μm obtained by etching were broken by heat-treatment.

Example 7 (Comparative Example)

Into an autoclave having an internal volume of 200 cc, were added 30.6 g (0.1 mol) of MPOH and 170 g (0.02 mol as a radical-generating source) of 5 wt % solution (solvent: 225 cb) of PBPO, and the mixture was cooled with liquid nitrogen and was degassed, and was reacted at 40° C. for 5 hours. The reaction solution was subjected to distillation under reduced pressure to remove a low boiling point component, and was vacuum-dried to obtain 18 g of MPOH homopolymer (average polymerization degree 3.4).

With regard to the homopolymer thus obtained, a —COOCH$_3$ group was converted into an amide group, and the amide group thus obtained was further converted into a 40° C. for 5 hours.

The reaction solution was subjected to distillation under reduced pressure to remove a low boiling point component, and was vacuum-dried to obtain 7.9 g of MPOH homopolymer (7-mer).

Thereafter, a —COOCH$_3$ group was converted to an amide group by reacting with ammonia, and the amide group was then converted into a cyano group by using trifluoroacetic anhydride/pyridine. 2 g of the homopolymer thus obtained was dissolved in 8 g of perfluorobutylamine, and 0.1 g of trifluoroacetoamidine was added thereto, and the resultant mixture was fully stirred and was filtrated through a PTFE filter having a pore diameter of 0.5μ.

The filtrated solution was spin-coated on a silicon wafer, and was dried at 150° C. to form a thin film having a thickness of 2 μm, and was heat-treated under nitrogen atmosphere at 300° C. for 1 hour. Infrared absorption spectrum of this thin film exhibited a strong absorption of a triazine ring but did not exhibit an absorption of a cyano group.

Checker-like scratches were made on the above obtained thin film in accordance with JIS-K5400, and the thin film was heat-treated at 300° C. for 1 hour, but there was no change in the checker-like shape. The thin film was heat-treated at 300° C. for 1 hour again, and pores having a pore size of 2 μm were made on the thin film by part by weight to 100 parts by weight of the fluorine-containing polymer and was dissolved at 65° C. while stirring for 30 minutes to obtain a fluorine-containing polymer solution.

Thereafter, E glass cloth (thickness 0.05 mm) was impregnated with the above obtained fluorine-containing polymer solution, and was dried at 150° C. for 10 minutes to obtain a prepreg. Copper foils were placed on both sides of the prepreg thus obtained, and the resultant composite was heat-pressed at 150° C. for 1 hour and then at 240° C. for 1 hour. The laminate board having copper foils thus obtained had a relative dielectric constant of 2.6.

Example 9

Ammonia gas was blown into a diethylether solution of perfluoro(adiponitrile), and was dried to prepare a perfluoro(adiponitrile)-ammonia adduct. With regard to the adduct thus prepared, about half of cyano groups of a starting material were converted into amidine groups by reaction of 1:1 (mol ratio) of a cyano group and ammonia, and the remaining material was converted into an imidoylamidine structure by reaction of 2:1 (mol ratio) of a cyano group and ammonia.

The same procedure as in Example 8 was repeated, except that the above prepared adduct was added in an amount of 5 parts by weight to 100 parts by weight a fluorine-containing polymer in place of Zn(C$_7$F$_{15}$COO)$_2$. The laminate board having copper foils attached had a relative dielectric constant of 2.6.

Example 10

PTFE porous material film (thickness 0.1 mm, porosity 70%) was impregnated with the fluorine-containing polymer solution obtained in Example 8, and was dried at 150° C. for 10 minutes to obtain a prepreg. Copper foils were placed on both sides of the prepreg thus obtained, and the resultant composite was heat-pressed at 150° C. for 1 hour and then at 240° C. for 1 hour. The copper foil-attached laminate board thus obtained had a relative dielectric constant of 2.2.

Example 11

The same procedure as in Example 9 was repeated, except that PTFE porous material film (thickness 0.1 mm, porosity 70%) was used in place of E glass cloth (thickness 0.05 mm). The copper foil-attached laminate board thus obtained had a relative dielectric constant of 2.2.

Example 12 (Comparative Example)

The same procedure as in Example 8 was repeated, except that an epoxy resin solution (dielectric constant of cured material: 4.5) was used in place of the fluorine-containing polymer solution of Example 8. The copper foil-attached laminate board thus obtained had a relative dielectric constant of 4.0.

Example 13

91.8 g of MPOH and 2.1 g of DIPDC were placed in a glass flask of an inner volume of 200 cc, and were reacted at 50° C. for 10 hours after replacing the atmosphere in the glass flask by nitrogen. After reaction, the reaction solution was subjected to distillation to remove a low boiling point component and an unreacted material, and 2 g of methanol was added thereto and the resultant mixture was stirred and then vacuum-dried to obtain 65 g of MPOH polymer (25-mer).

Into a four-forked flask of 100 cc equipped with a stirrer, a gas-introducing inlet and a purging inlet, were placed 15.3 g of the above prepared MPOH polymer and 60 cc of MTBE previously dehydrated by molecular sieves 4A (porous synthetic zeolite), and the mixture was uniformly dissolved, and 2.6 g of ammonia gas was introduced thereinto while cooling with ice water. Thereafter, the temperature was raised to room temperature, and the mixture was stirred for one night. A small amount of a white deposit occurred in a solution was removed by filtration, and MTBE solution of an amidated material of the MPOH polymer was obtained. The solution thus obtained was cast on a KBr plate, and was dried. Infrared absorption spectrum of the product exhibited a complete disappearance of an ester group and also exhibited a strong absorption of 1740 cm$^{-1}$ by an amide group.

The total amount of the above prepared MTBE solution of amidated material of MPOH polymer was placed in a four-forked flask of 100 cc equipped with a stirrer, a gas-introducing inlet and a purging inlet, and nitrogen was introduced through the gas-introducing inlet into the solution to cause bubbling, thereby purging ammonia gas remained in the system. Thereafter, MTBE previously dehydrated with molecular sieves 4A was added to the solution so as to make the total amount of the MTBE solution 60 cc, and the resultant solution was cooled with ice water, and 15.8 g of pyridine was added thereto. Thereafter, 21 g of trifluoroacetic anhydride was dropwise added thereto so as to control the temperature in the system at most 10° C. Thereafter, the resultant mixture was stirred and reacted for 2 hours to obtain a light brown transparent liquid.

The light brown transparent liquid thus obtained was placed in ice water, and the MTBE layer thus obtained was washed with ion-exchanged water three times, and the solvent was distilled off by an evaporator. Thereafter, the resultant solution was vacuum-dried to obtain a fluorine-containing polymer. Infrared absorption spectrum of the fluorine-containing polymer exhibited an absorption at 2260 cm$^{-1}$ by a cyano group. With regard to the fluorine-containing polymer, a conversion of a —COOCH$_3$ group of a side chain into a cyano group was 94%.

Example 14

The MTBE solution obtained by filtration after reacting with ammonia gas in Example 13 was heated under reduced pressure to remove a solvent by using a vacuum pump, and when it is concentrated to attain a concentration of about 70%, 100 cc of DMF previously dehydrated by molecular sieves 4A was added thereto and was uniformly mixed. The resultant mixture was concentrated again to attain its concentration of about 70%, and 50 cc of DMF was added thereto again to dissolve the content, and a solution substantially substituted with DMF was obtained. The solution thus obtained was cooled with ice water, and 15.8 g of pyridine was added thereto, and 21 g of trifluoroacetic anhydride was dropwise added thereto so as to control the temperature in the system at most 10° C. Thereafter, the mixture was stirred and reacted at room temperature for 2 hours to obtain a light yellow deposit.

The deposit thus obtained was stirred in DMF once, and the supernatant liquid was removed, and the deposit thus obtained was dissolved in 100 cc of MTBE, and was washed with 100 cc of water twice, and MTBE layer was recovered and was subjected to an evaporator to distill off the solvent, and was then vacuum-dried to obtain a fluorine-containing polymer. Infrared absorption spectrum of the fluorine-containing polymer exhibited a strong absorption at 2260 cm$^{-1}$ by a cyano group. With regard to the fluorine-containing polymer, a conversion of a —COOCH$_3$ group of a side chain into a cyano group was 100%.

Example 15

MTBE was added to the fluorine-containing polymer obtained in Example 14 to prepare a 70 wt % solution, and Zn(C$_7$F$_{15}$COO)$_2$ was added in an mount of 3 parts by weight to 100 parts by weight of the polymer, and was stirred and dissolved at 60° C. for 30 minutes to obtain a fluorine-containing polymer solution.

Thereafter, E glass cloth (thickness 0.05 mm) was impregnated with the above prepared fluorine-containing polymer solution, and was dried at 150° C. for 10 minutes to obtain a prepreg. Copper foils were placed on both sides of the prepreg, and the resultant composite was heat-pressed at 150° C. for 1 hour and then at 240° C. for 1 hour. The copper foil-attached laminate board thus obtained had a relative dielectric constant of 2.55.

Example 16

The same procedure as in Example 9 was repeated, except that the fluorine-containing polymer used in Example 9 was replaced by the fluorine-containing polymer obtained in Example 14. The copper foil-attached laminate board thus obtained had a relative dielectric constant of 2.55.

Example 17

2 g of the fluorine-containing polymer obtained in Example 14 was dissolved in 8 g of heptafluoropropanol, and ammonia was blown thereinto to convert a cyano group of a side chain into an amidine group, and the resultant product was filtrated through a PTFE filter having a pore diameter of 0.5 μm.

The filtrated solution was spin-coated on a silicon wafer, and was dried at 150° C. to form a thin film having a thickness of about 2 μm, and the thin film thus formed was heat-treated at 300° C. for 1 hour under nitrogen atmosphere. Infrared absorption spectrum of the thin film exhibited a strong absorption of a triazine ring and did not exhibit an absorption of a cyano group.

Checker-like scratches were made on the thin film in accordance with JIS-K5400, and was heat-treated at 300° C. for 1 hour, but there was no change in the checker-like shape. Also, pores having a pore diameter of 2 μm were made by etching on a thin film heat-treated at 300° C. for 1 hour, and the thin film thus etched was heat-treated again at 300° C. for 1 hour, but there was no change in the pore shape.

This thin film had an elastic modulus of $5 \times 10^9$ dyn/cm² at 300° C.

Example 18

To 100 parts by weight of the fluorine-containing polymer obtained in Example 14, were added to 20 parts by weight of MTBE and each amine type curing agent of an amount as shown in the following Table 1, and each solution thus obtained was coated on a silicon wafer to form a coating film having a thickness of 1 mm. The coating film thus formed was subjected to curing reaction at 70° C. for 30 minutes and further at 200° C. for 2 hours. After curing, the coating film was measured with regard to an elastic modulus at 300° C., and the results are shown in the following Table 1.

TABLE 1

| Amine type curing agent | Parts by weight | Elastic modulus at 300° C. (dyn/cm²) |
| --- | --- | --- |
| Aniline | 3 | $2 \times 10^9$ |
| p-Phenylenediamine | 3 | $2 \times 10^9$ |
| n-Butylamine | 2 | $2 \times 10^9$ |
| Ethylenediamine | 2 | $2 \times 10^9$ |
| Hexamethyldisilazane | 5 | $2 \times 10^9$ |

Example 19

To 20 g of the fluorine-containing polymer obtained in Example 14, were added and mixed 0.5 g of 3-(p-anilino) propyltrimethoxysilane, 5 g of tetraethylsilicate and 10 g of MTBE, and the resultant mixture was coated on a silicon wafer to form a coating film, and was heated at 300° C. for 3 hours to obtain a cured film. The cured film thus obtained had a high elastic modulus of exceeding $1 \times 10^{10}$ dyn/cm² at a high temperature of 300° C.

Example 20

10 g of the fluorine-containing polymer obtained in Example 14 was dissolved in 10 g of MTBE, and 30 g of a 30 wt % n-butylether solution of Tonen Polysilazane (tradename manufactured by Tonen Company, Ltd.) was further added thereto, and the resultant mixture was coated on a silicon wafer to form a coating film, was heated at 150° C. for 3 hours to obtain a cured film. The cured film thus obtained had a high elastic modulus of exceeding $1 \times 10^{10}$ dyn/cm² at a high temperature of 300° C.

Example 21

10 g of the fluorine-containing polymer obtained in Example 14 was dissolved in 10 g of MTBE, and 0.3 g of aniline was added thereto to prepare a solution. The solution thus prepared was cast on a glass fiber-reinforced epoxy resin substrate, and was heated at 200° C. for 2 hours to form a cured film having a thickness of 100 μm. The film thus formed was irradiated with KrF excimer laser (0.2 J/pulse·cm², 10 pulse/sec) for 40 hours to form a through hole.

The thin film of the triazine ring-containing fluoropolymer of the present invention has not only excellent mechanical properties and pyrolysis resistance but also a satisfactorily low dielectric constant, and is useful as a film for electronic articles such as a buffer coating film of a semiconductor element, a passivation film of a semiconductor element, an insulating film between layers of a semiconductor element, an α ray-shielding film of a semiconductor element, and an insulating film between layers of a multi-layered circuit board, and the like.

Further, the prepreg of the present invention not only maintains excellent properties of a fluororesin (such as a low dielectric constant, a high chemical resistance, a high heat resistance, a high fire resistance and the like) but also is easily moldable. The prepreg of the present invention is useful as an insulating material having a low dielectric constant for a print circuit board applicable to speed-up signal propagation.

What is claimed is:

1. An electronic article having a thin film of a triazine ring-containing fluoropolymer obtained by trimerization of a cyano group of a cyano group-containing fluoropolymer having a polymerization unit of the formula (1)

$$—[CF_2—CF(A^1)]— \qquad (1)$$

wherein $A^1$ is —$OR^1CN$, —CN or —$R^1CN$, and $R^1$ is a $C_1$–$C_{15}$ polyfluoroalkylene group which may have an ether bond, and wherein said fluoropolymer is a homopolymer or a copolymer containing at most 50 mol % of polymerization units from fluorine-containing monomers other than those having formula (I).

2. The electronic article according to claim 1, wherein the cyano group-containing fluoropolymer contains averagely at least 4 polymerization units of the above formula (1).

3. The electronic article according to claim 1, wherein at least one terminal of both terminals of the cyano group-containing fluoropolymer is a polyfluoroalkyl group which may have an ether bond.

4. The electronic article according to claim 1, wherein the thin film is a buffer coating film of a semiconductor element, a passivation film of a semiconductor element, an insulating film between layers of a semiconductor element, an α ray-shielding film of a semiconductor element or an insulating film between layers of a multi-layered circuit board.

5. The electronic article according to claim 2, wherein the cyano group-containing fluoropolymer containing averagely at least 4 polymerization units of the above formula (1) is obtained by polymerizing a vinyl compound of the formula (2) in the presence of a polyfluoroalkyl group-containing radical-generating source in an amount of from 0.01 to 10 mols to 100 mols of the vinyl compound of the formula (2):

$$CF_2=CF(A^1) \qquad (2)$$

wherein $A^1$ is —$OR^1CN$, —CN or —$R^1CN$, and $R^1$ is a $C_1$–$C_{15}$ polyfluoroalkylene group which may have an ether bond.

6. The electronic article according to claim 1, wherein the copolymer contains at most 30 mol % of polymerization units from fluorine-containing monomers other than those having formula (I).

* * * * *